(12) United States Patent
Makino et al.

(10) Patent No.: US 11,605,771 B2
(45) Date of Patent: Mar. 14, 2023

(54) THERMOELECTRIC POWER-GENERATING DEVICE

(71) Applicant: KELK Ltd., Kanagawa (JP)

(72) Inventors: Kazuya Makino, Kanagawa (JP); Hirokuni Hachiuma, Kanagawa (JP)

(73) Assignee: KELK Ltd., Kanagawa (JP)

(*) Notice: Subject to any disclaimer, the term of this patent is extended or adjusted under 35 U.S.C. 154(b) by 592 days.

(21) Appl. No.: 16/492,661

(22) PCT Filed: Mar. 6, 2018

(86) PCT No.: PCT/JP2018/008499
§ 371 (c)(1),
(2) Date: Sep. 10, 2019

(87) PCT Pub. No.: WO2018/193734
PCT Pub. Date: Oct. 25, 2018

(65) Prior Publication Data
US 2022/0115575 A1   Apr. 14, 2022

(30) Foreign Application Priority Data

Apr. 21, 2017 (JP) .............................. JP2017-084777

(51) Int. Cl.
H01L 35/32 (2006.01)

(52) U.S. Cl.
CPC .................................... H01L 35/32 (2013.01)

(58) Field of Classification Search
CPC ........................................................ H01L 35/32
See application file for complete search history.

(56) References Cited

U.S. PATENT DOCUMENTS

2015/0013740 A1   1/2015 Kaibe et al.

FOREIGN PATENT DOCUMENTS

| CN | 104410329 | 3/2015 |
| JP | 1999-307826 | 11/1999 |
| JP | 2000-286462 | 10/2000 |
| JP | 2003-174204 | 6/2003 |
| JP | 2004152921 A | 5/2004 |
| JP | 2006-303037 | 11/2006 |
| JP | 2007123564 A | 5/2007 |
| JP | 2012-234975 | 11/2012 |
| JP | 2012234975 A * | 11/2012 |

(Continued)

OTHER PUBLICATIONS

Iizuka et al., JP2012234975 A, English Machine Translation, pp. 1-8. (Year: 2012).*

(Continued)

Primary Examiner — Tae-Sik Kang
(74) Attorney, Agent, or Firm — Fish & Richardson P.C.

(57) ABSTRACT

A thermoelectric generator includes: a heat-receiving plate having a heat-receiving surface configured to receive radiant heat; a thermoelectric generation module provided to a surface of the heat-receiving plate opposite from the heat-receiving surface and having an area smaller than an area of the heat-receiving plate; a cooling plate provided to a surface of the thermoelectric generation module opposite from a surface where the heat-receiving plate is provided; and a temperature equalizer provided to the heat-receiving plate and configured to equalize a temperature of the heat-receiving surface.

14 Claims, 16 Drawing Sheets

(56) References Cited

FOREIGN PATENT DOCUMENTS

JP      2015140713 A    8/2015
JP      2016-009787     1/2016

OTHER PUBLICATIONS

PCT International Search Report in International Appln. No. PCT/JP2018/008499, dated May 15, 2018, pp. 4 (with English Translation).
Japanese Office Action in Japanese Application No. 2017-084777, dated Jan. 12, 2021, 7 pages (with English translation).
PCT International Preliminary Report on Patentability in Appln. No. PCT/JP2018/008499, dated Oct. 22, 2019, 6 pages.
CN Office Action in Chinese Appln. No. 201880018236.4, dated Sep. 29, 2022, 10 pages (with Translation).

* cited by examiner

FIG.5
RELATED ART
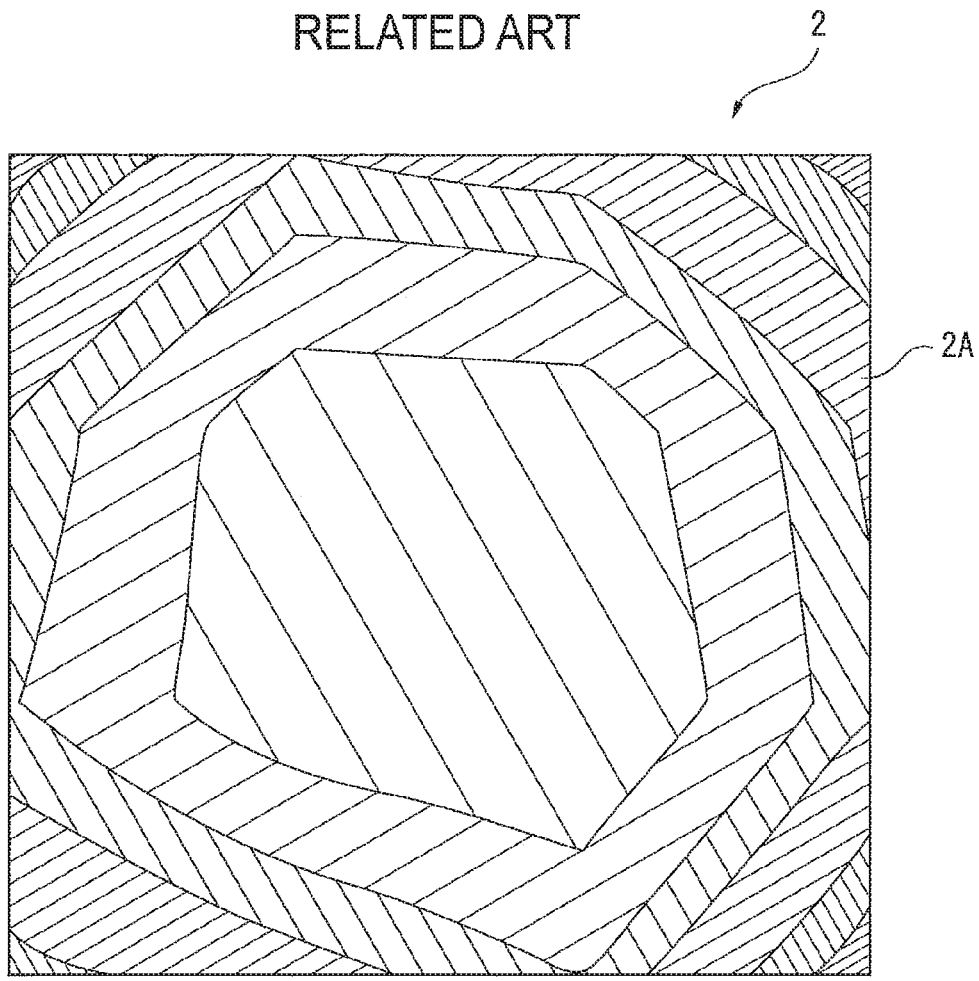
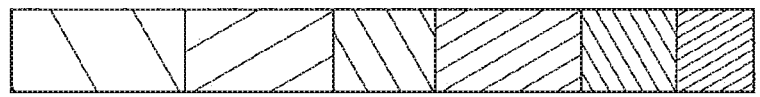
250°C 300°C

THERMOELECTRIC POWER-GENERATING DEVICE

CROSS-REFERENCE TO RELATED APPLICATIONS

This application claims priority to International Application No. PCT/JP2018/008499 filed on Mar. 6, 2018, which claims priority to Japanese Application No. 2017-084777, filed on Apr. 21, 2017, the contents of which are incorporated herein in their entirety.

TECHNICAL FIELD

The present invention relates to a thermoelectric generator.

BACKGROUND ART

There has been typically known a thermoelectric generator including a heat-receiving plate, a cooling plate, and a thermoelectric generation module interposed between the heat-receiving plate and the cooling plate (see, for instance, Patent Literature 1).

In such a thermoelectric generator, radiant heat is received by the heat-receiving plate and a cooling water is circulated in the cooling plate, thereby generating a temperature difference between the heat-receiving plate and the cooling plate, leading to power generation by the thermoelectric generation module due to the temperature difference.

An entire heat-receiving surface of a typical heat-receiving plate is covered with a black coating or the like in order to improve an absorption rate of the radiant heat.

CITATION LIST

Patent Literature(s)

Patent Literature 1: JP2016-9787 A

SUMMARY OF THE INVENTION

Problem(s) to be Solved by the Invention

In the technique disclosed in Patent Literature 1, a size of the thermoelectric generation module is set to be smaller than a size of the heat-receiving plate in a plan view in order to provide a sealing structure and the like, so that a periphery of the heat-receiving plate is overheated to increase thermal stress at a periphery of the thermoelectric generation module. Consequently, soldered joints of thermoelectric elements at the periphery of the thermoelectric generation module are peeled off, resulting in disconnection.

An object of the invention is to provide a thermoelectric generation module causing no damage to peripheral ends of a thermoelectric generation module even when a heat-receiving plate is heated by radiant heat.

Means for Solving the Problem(s)

According to an aspect of the invention, a thermoelectric generator includes: a heat-receiving plate having a heat-receiving surface to receive radiant heat; a thermoelectric generation module provided to a surface of the heat-receiving plate opposite from the heat-receiving surface and having an area smaller than an area of the heat-receiving plate; a cooling plate provided to a surface of the thermoelectric generation module opposite from a surface where the heat-receiving plate is provided; and a temperature equalizer provided to the heat-receiving plate and configured to equalize a temperature of the heat-receiving surface.

According to the above aspect of the invention, since the thermoelectric generator includes the temperature equalizer, the peripheral ends of the thermoelectric generation module is not excessively heated by the radiant heat. Accordingly, since thermal stress is not increased at the peripheral ends of the thermoelectric generation module, damage due to overheating at the joint of the thermoelectric elements at the peripheral ends of the thermoelectric generation module can be prevented.

BRIEF DESCRIPTION OF DRAWING(S)

FIG. 5 is a plan view showing a temperature distribution on a heat-receiving surface of a typical heat-receiving plate.

DESCRIPTION OF EMBODIMENT(S)

[1] Structure of Thermoelectric Generator 1

Figure 1:
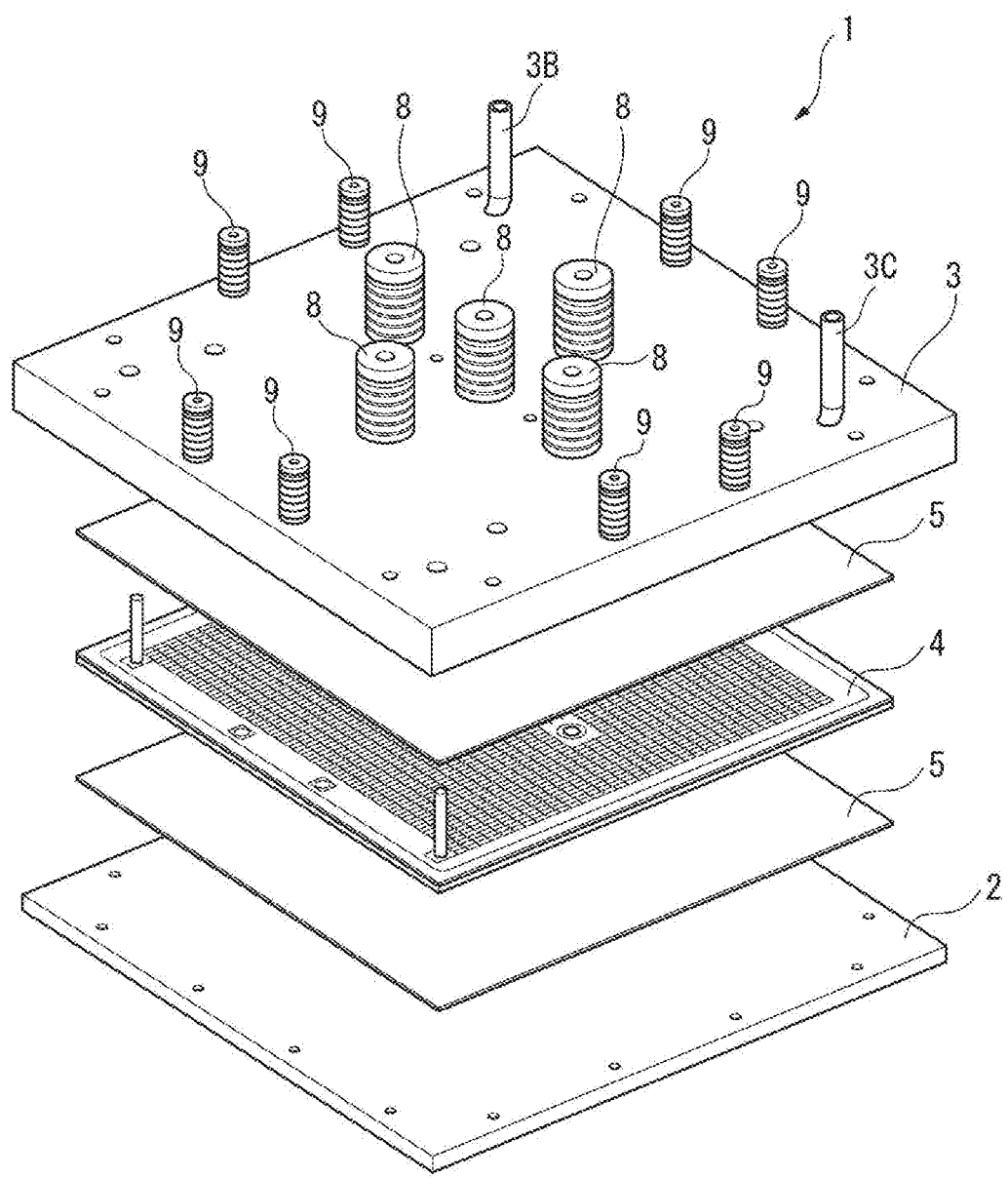
FIG. 1 is an exploded perspective view showing a structure of a thermoelectric generator according to an exemplary embodiment of the invention.
Figure 2:
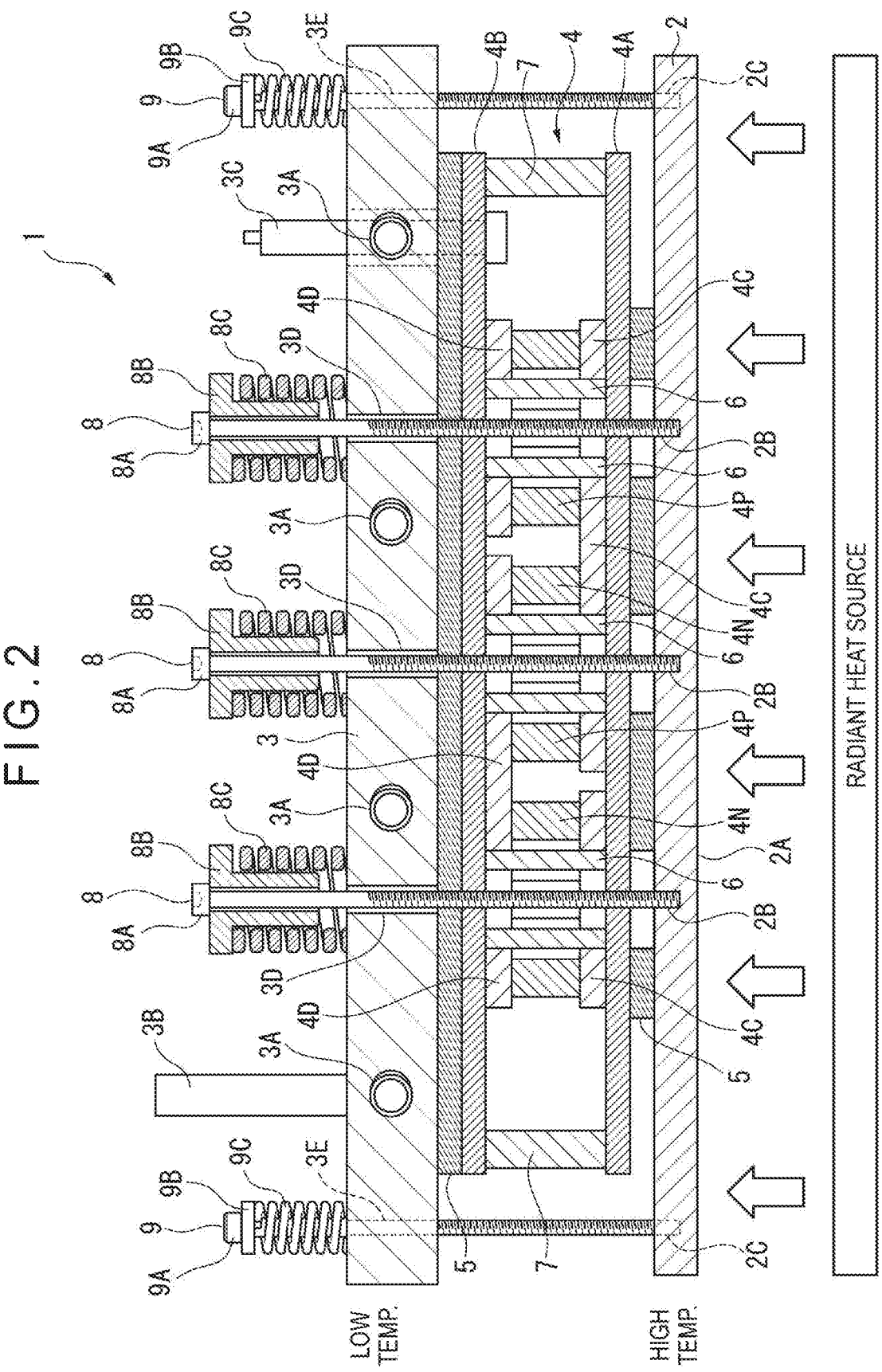
FIG. 2 is a cross-sectional view showing the structure of the thermoelectric generator according to the exemplary embodiment.

FIG. 1 is an exploded perspective view of a thermoelectric generator 1. FIG. 2 is a cross sectional view of the thermoelectric generator 1. The thermoelectric generator 1 includes a heat-receiving plate 2, a cooling plate 3, a thermoelectric generation module 4, and carbon sheets 5. The thermoelectric generator 1 receives radiant heat with the heat-receiving plate 2 and converts heat energy into electric energy with the thermoelectric generation module 4 with use of a temperature difference between the heat-receiving plate 2 and the cooling plate 3.

The heat-receiving plate 2 is, for instance, in a form of a rectangular plate made of iron, copper or aluminum. A lower surface of the heat-receiving plate 2 is defined as a heat-receiving surface 2A and is heated to about 280 degrees C. by radiant heat. As shown in FIG. 2, a plurality of female screw holes 2B, 2C are formed on an opposite surface of the heat-receiving plate 2 from the heat-receiving surface 2A.

The cooling plate 3, which is, for instance, in a form of a rectangular thick plate made of aluminum, includes a cooling circuit 3A as shown in FIG. 2 in which a cooling fluid such as a cooling water circulates. When the cooling water flows into the cooling circuit 3A, an entirety of the cooling plate 3 is kept to be cooled approximately at a temperature in a range from 20 degrees C. to 40 degrees C.

The cooling circuit 3A is connected to a feed pipe 3B and a return pipe 3C for the cooling water. The cooling water is fed from the feed pipe 3B to cool the cooling plate 3 through the cooling circuit 3A and subsequently is discharged from the return pipe 3C.

Moreover, the cooling plate 3 has five holes 3D substantially at the center, which penetrate the cooling plate 3 from a front surface to a rear surface thereof, and four holes 3E at peripheral ends.

Figure 3:
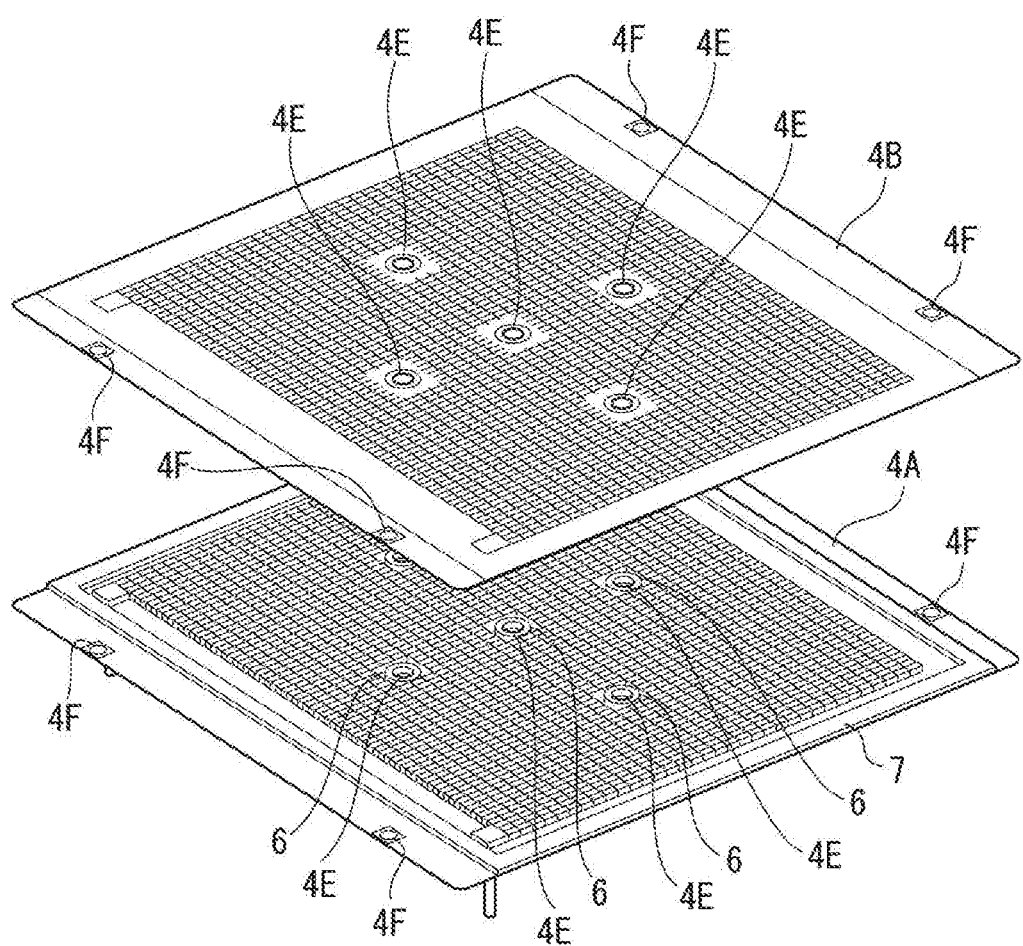
FIG. 3 is an exploded perspective view showing a structure of a thermoelectric generation module in the exemplary embodiment.

The thermoelectric generation module 4 is interposed between the heat-receiving plate 2 and the cooling plate 3. The thermoelectric generation module 4 includes a high-temperature-side substrate 4A; and a low-temperature-side substrate 4B as shown in FIG. 3. The high-temperature-side substrate 4A and the low-temperature-side substrate 4B, which are each in a form of a polyimide-made film having a surface on which an electrode is formed, are disposed with respective electrode surfaces 4C and 4D (see FIG. 2) facing each other.

Figure 4:
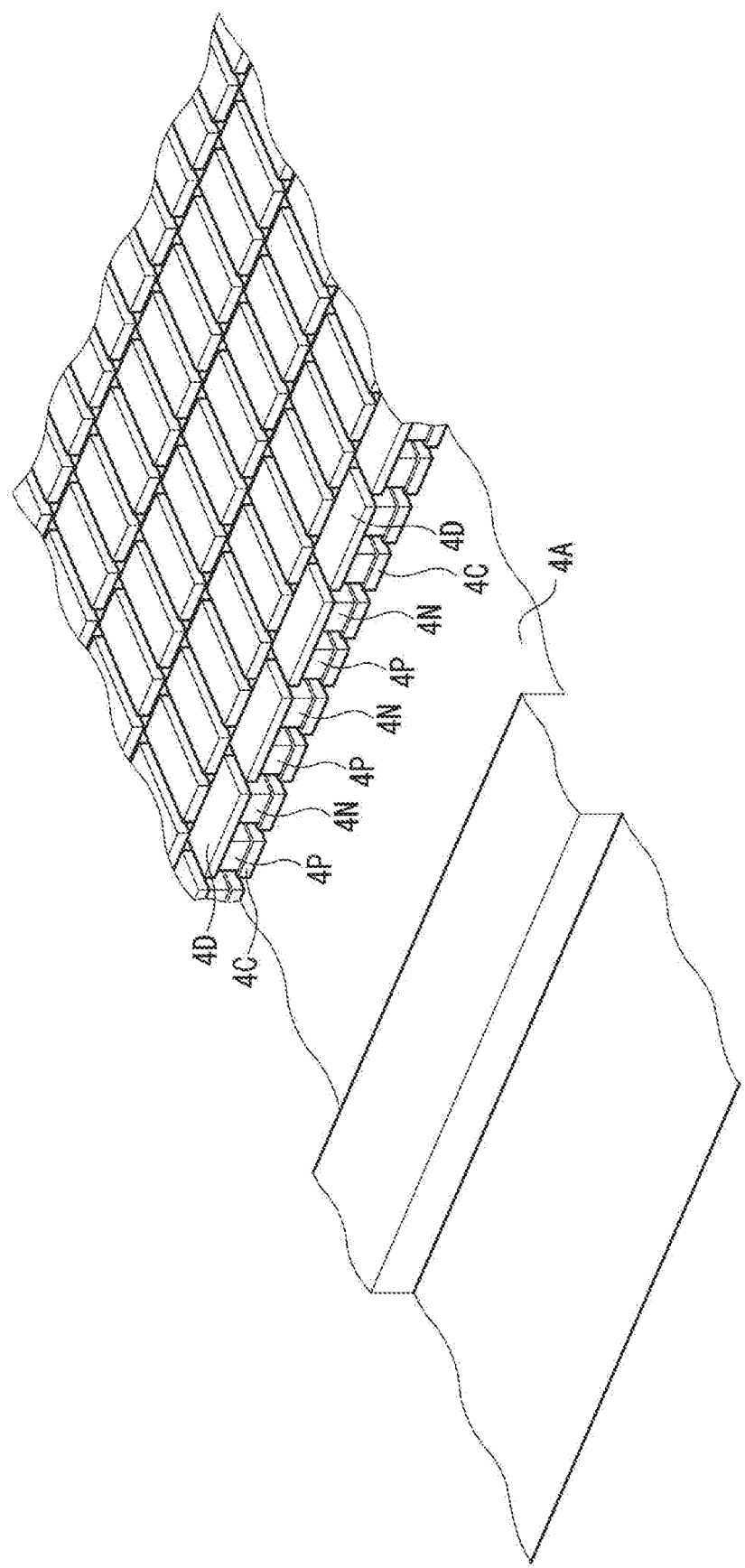
FIG. 4 is an exploded perspective view showing a relevant part of the structure of the thermoelectric generation module in the exemplary embodiment.

A plurality of P-type thermoelectric elements 4P and a plurality of N-type thermoelectric elements 4N are alternately arranged between the high-temperature-side substrate 4A and the low-temperature-side substrate 4B as shown in FIGS. 2 and 4. The thermoelectric elements 4P and 4N provide electrical continuity between the electrode surface 4C of the high-temperature-side substrate 4A and the electrode surface 4D of the low-temperature-side substrate 4B. The electrode surface 4C of the high-temperature-side substrate 4A and the electrode surface 4D of the low-temperature-side substrate 4B are soldered to end surfaces of the thermoelectric elements 4P and 4N.

As shown in FIG. 3, each of the high-temperature-side substrate 4A and the low-temperature-side substrate 4B has five holes 4E at the center and four holes 4F at peripheral ends. An annular inner sealing frame 6 is provided around each of the holes 4E. A rectangular peripheral sealing frame 7 is provided at a periphery of the low-temperature-side substrate 4B. The inner sealing frame 6 and the peripheral sealing frame 7 are formed of a metal material such as iron, copper, and aluminum.

As shown in FIG. 1, the carbon sheets 5 are respectively interposed between the heat-receiving plate 2 and the high-temperature-side substrate 4A and between the cooling plate 3 and the low-temperature-side substrate 4B. The carbon sheets 5 function as a heat transfer layer for transferring heat received at the heat-receiving plate 2 to the high-temperature-side substrate 4A and transferring heat of the low-temperature-side substrate 4B to the cooling plate 3.

Each of the carbon sheets 5 is in a form of a rectangular sheet material whose outer periphery meets an inner periphery of the peripheral sealing frame 7. The carbon sheet 5 near the high-temperature-side substrate 4A is kept in non-contact with a part of the high-temperature-side substrate 4A corresponding to the peripheral sealing frame 7. In other words, an air layer between the carbon sheet 5 and the part of the high-temperature-side substrate 4A corresponding to the peripheral sealing frame 7 functions as a heat insulating layer.

Each of the carbon sheets 5 also has five holes at a central part in conformity with the arrangement of the inner sealing frames 6. Each of the holes is larger than an outline of each of the annular inner sealing frames 6. The carbon sheet 5 near the high-temperature-side substrate 4A is kept in non-contact with parts of the high-temperature-side substrate 4A corresponding to the annular inner sealing frames 6. An air layer between the carbon sheet 5 and each of the parts of the high-temperature-side substrate 4A corresponding to the annular inner sealing frames 6 functions as a heat insulating layer.

The heat-receiving plate 2, the cooling plate 3, the thermoelectric generation module 4, and the carbon sheets 5 in the above arrangement are integrated using five first fastening members 8 and eight second fastening members 9.

Each of the first fastening members 8 includes a bolt 8A, a receiving member 8B, and a coil spring 8C.

The bolt 8A is sequentially inserted into each of the holes 3D of the cooling plate 3, each of the holes 4E of the thermoelectric generation module, and each of the holes of the carbon sheet 5 to be screwed into each of the female screw holes 2B of the heat-receiving plate 2.

The receiving member 8B, which is in a form of a metallic cylinder to receive the bolt 8A, has a flange at an end.

The coil spring 8C is disposed around an outer circumferential portion of the receiving member 8B. When the bolt 8A is screwed into each of the female screw holes 2B of the heat-receiving plate 2, the coil spring 8C is compressed by the flange of the receiving member 8B in the insertion direction to bias the cooling plate 3 toward the heat-receiving plate 2.

The second fastening members 9 are members of fastening the peripheral ends of the heat-receiving plate 2 and the peripheral ends of the cooling plate 3. The second fastening members 9 are structurally substantially the same as the first fastening members 8, and specifically each include a bolt 9A, a receiving member 9B, and a coil spring 9C.

[2] Temperature Distribution of Typical Heat-Receiving Plate 2

FIG. 5 shows a temperature distribution of the heat-receiving plate 2 uniformly heated by radiant heat. The heat-receiving surface 2A of the heat-receiving plate 2 is entirely covered with a black coating. As understood from FIG. 5, the lowest temperature part of the heat-receiving surface 2A is at a substantially central part where the thermoelectric generation module 4 is disposed to positively transfer heat. The temperature increases from the lowest temperature part toward the periphery of the heat-receiving surface 2A. The highest temperature part is at corners of the rectangular heat-receiving surface 2A.

Figure 6:
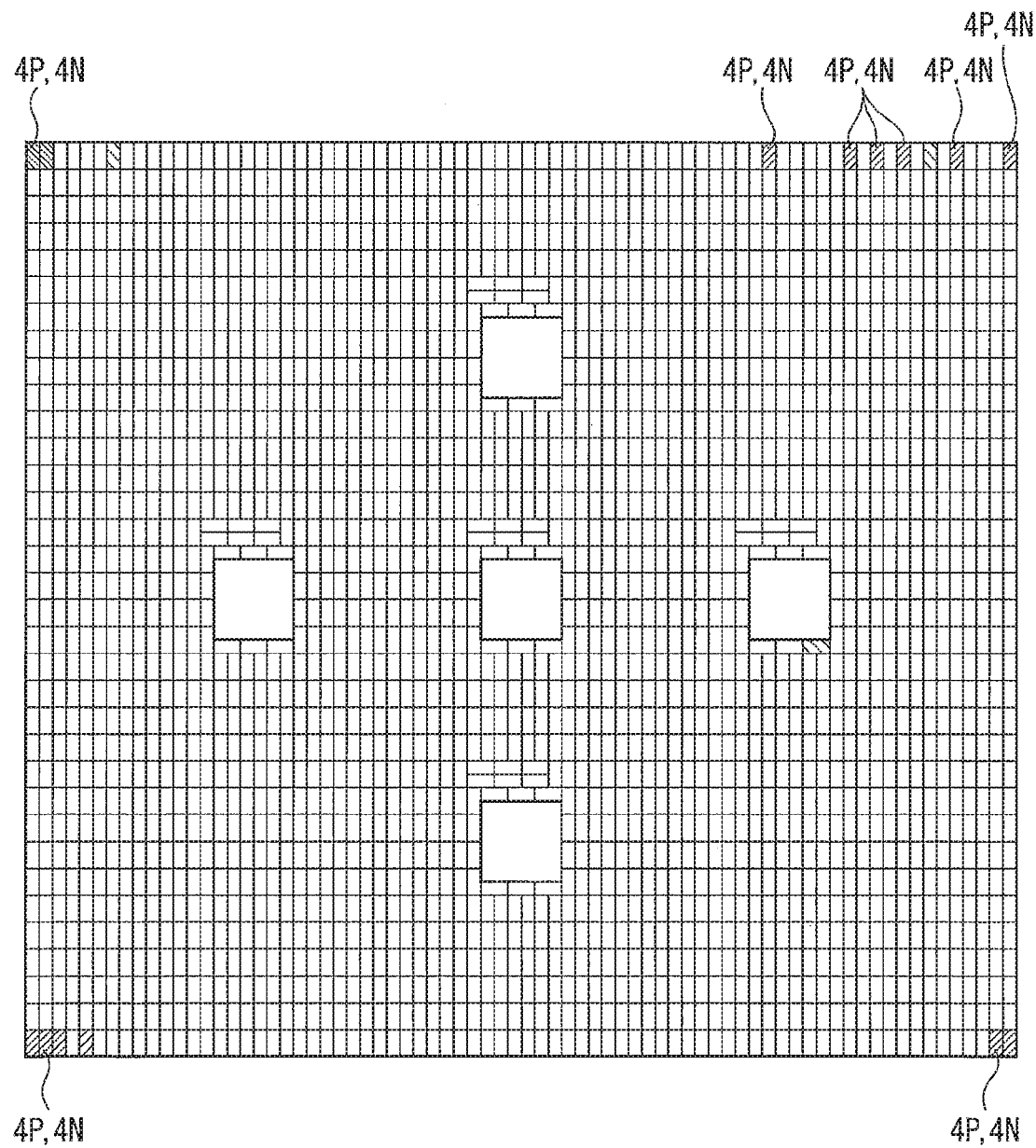
FIG. 6 is a plan view showing damaged parts occurring in a typical thermoelectric generation module.

In the heat-receiving plate 2 having such a temperature difference, the temperature of the peripheral ends of the heat-receiving plate 2 is increased faster, which causes damage to the thermoelectric elements 4P and 4N at peripheral ends of the thermoelectric generation module 4 as shown in FIG. 6. This damage is caused by peeling off of a soldering portion jointing the thermoelectric elements 4P and 4N to the high-temperature-side substrate 4A and eventually disconnecting therebetween.

[3] Structure of Temperature Equalizer

Figure 7:
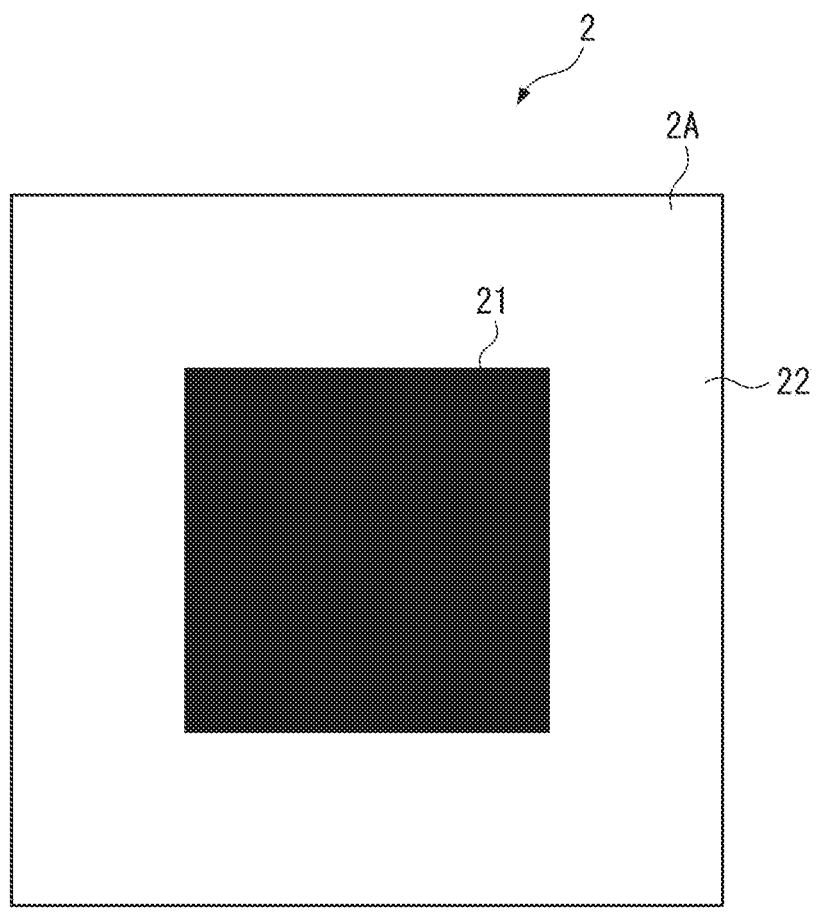
FIG. 7 is a plan view showing a structure of a heat-receiving plate in the exemplary embodiment.

Accordingly, in the exemplary embodiment, the central region 21 of the heat-receiving plate 2 is covered with a black coating to increase a radiant heat absorption rate, and the peripheral region 22 is uncoated to be left in color of anodized-aluminum or the like to decrease the radiant heat absorption rate as shown in FIG. 7, thereby obtaining temperature equalization on the heat-receiving surface 2A. In other words, the temperature equalizer is configured to control the radiant heat absorption rate at the central region 21 and the peripheral region 22 of the heat-receiving plate 2.

The radiant heat absorption rate at the central region 21 with the black coating is 96%. The radiant heat absorption rate at the peripheral region 22 in color of anodized-aluminum ranges from 15% to 20%. It should be noted that the central region 21 at the central part of the heat-receiving plate 2 can be formed in any shape such as a rectangle and a circle while the heat-receiving plate 2 is square. Moreover, the central region 21 may be covered with a coating in a color other than black and the peripheral region 22 may be covered with a white coating or the like.

When the central region 21 is covered with a black coating and the peripheral region 22 is in color of anodized-aluminum, an area ratio of the central region 21 to the thermoelectric generation module 4 is preferably determined such that a temperature difference between the peripheral region 22 and the central region 21 is 10 degrees C. or less.

Figure 8:
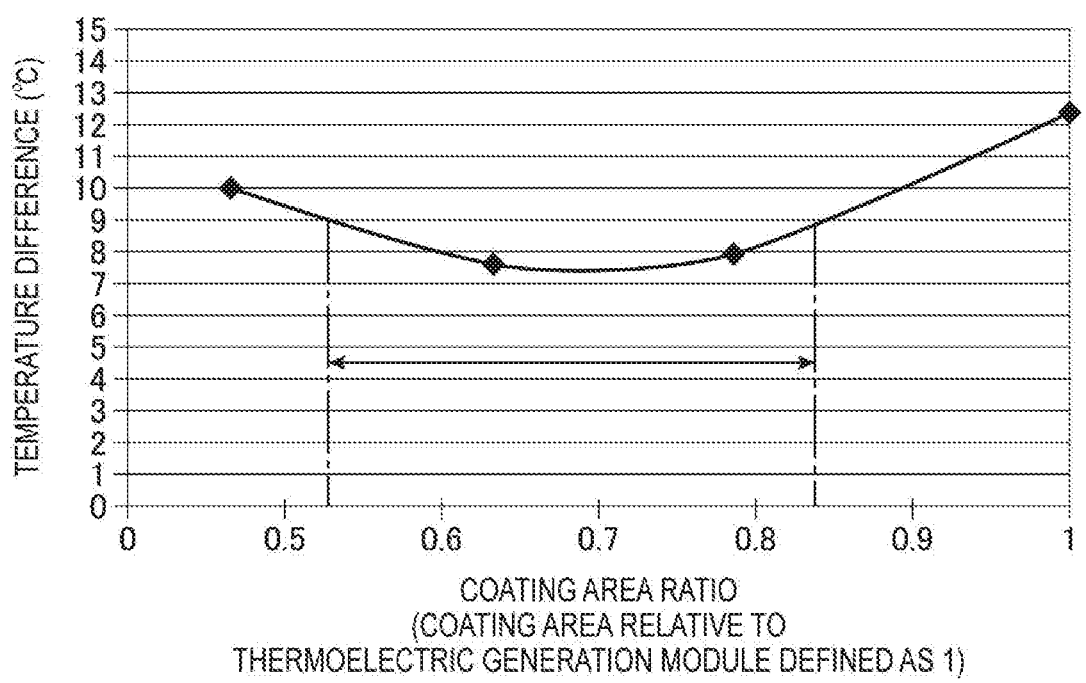
FIG. 8 is a graph showing a change in a temperature difference in the heat-receiving plate in accordance with an area ratio of a temperature equalizer in the exemplary embodiment.

Specific measurement results of the area ratio of the central region 21 with the black coating to the thermoelectric generation module 4 are shown in Table 1 and FIG. 8. An area of the thermoelectric generation module 4 is 48400 mm$^2$ (220 mm×220 mm) and an area of the heat-receiving plate 2 is 80556 mm$^2$ (284 mm×284 mm).

As understood from Table 1 and FIG. 8, a difference in temperature less than 10 degrees C. is achievable at the area ratio ranging from 0.53 to 0.84.

TABLE 1

| Coating Range | Temperature Difference (° C.) | Coating Area (mm$^2$) | Area Ratio |
| --- | --- | --- | --- |
| 220 | 12.4 | 48400 | 1 |
| 195 | 8.0 | 38025 | 0.78 |
| 175 | 7.7 | 30625 | 0.62 |
| 150 | 10.1 | 22500 | 0.47 |

Figure 9:
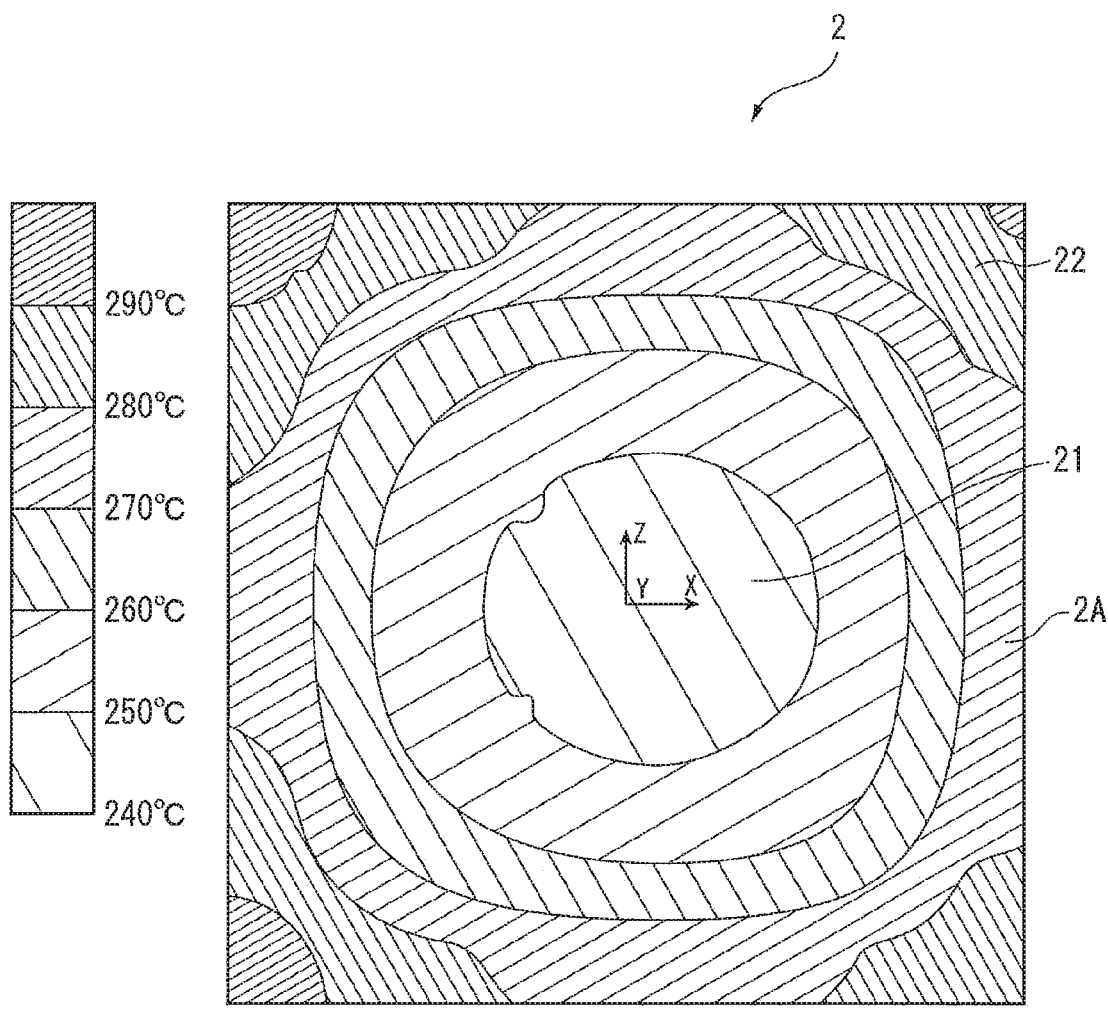
FIG. 9 is a plan view showing a temperature distribution on a heat-receiving surface of another typical heat-receiving plate.

The upper limit of the temperature of the heat-receiving plate 2 is 290 degrees C. for durability. When the heat-receiving surface 2A is entirely covered with the black coating, the lowest temperature at the central region 21 is 257 degrees C. when the highest temperature at the peripheral region 22 is 290 degrees C. as shown in FIG. 9. An average temperature of the heat-receiving plate 2 is 273.5 degrees C.

Figure 10:
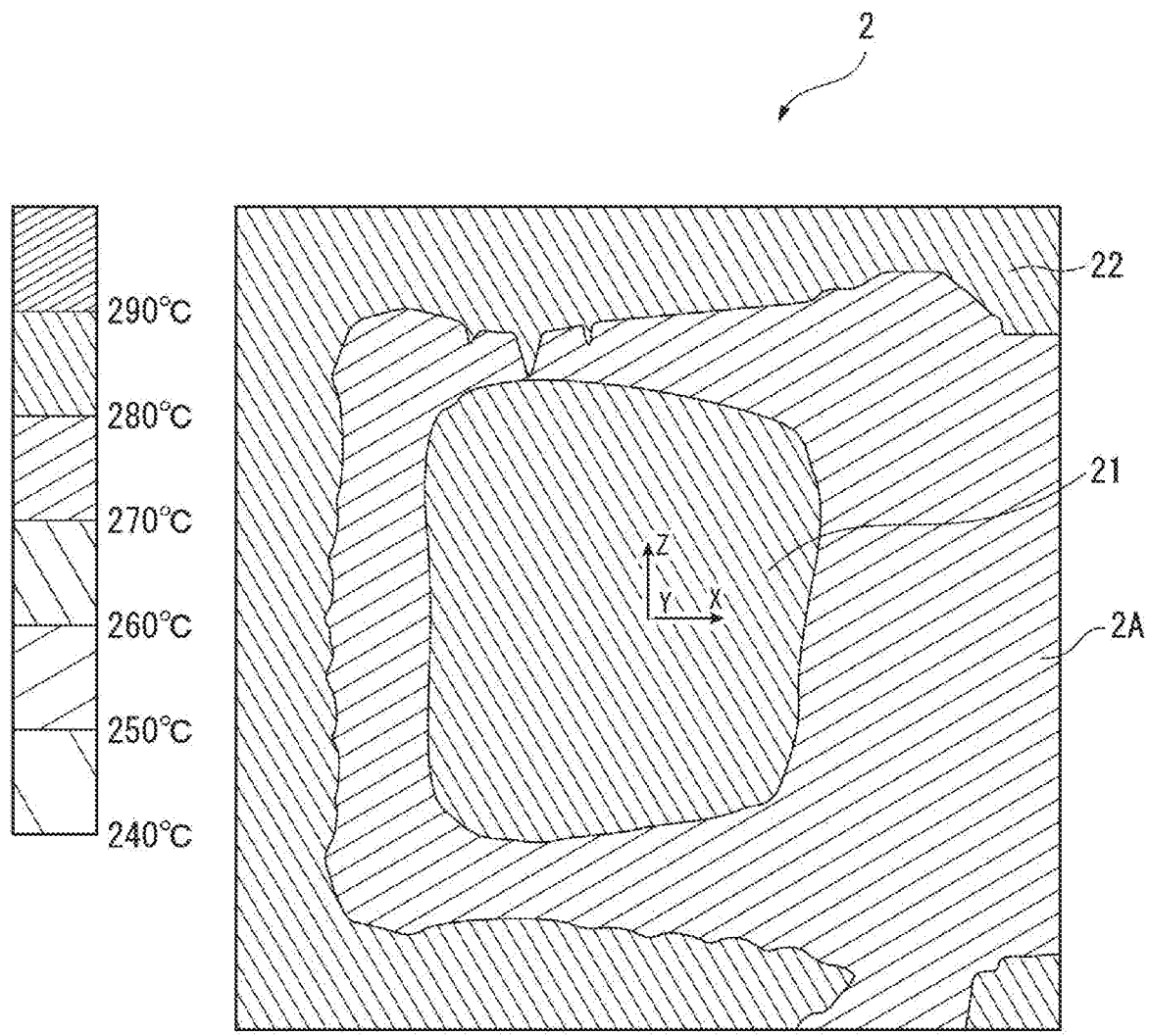
FIG. 10 is a plan view showing a temperature distribution on a heat-receiving surface of still another typical heat-receiving plate.

In contrast, when the central region 21 is covered with the black coating and the peripheral region 22 is left in color of anodized-aluminum (in color of a bare metal) in a 175-mm square, the lowest temperature at the central region 21 is 282 degrees C. when the highest temperature at the peripheral region 22 is 290 degrees C. as shown in FIG. 10. The average temperature of the heat-receiving plate 2 is 286 degrees C.

This means that the average temperature of the heat-receiving plate 2 can be increased. Such an increase in the average temperature enables to enlarge the temperature difference between the heat-receiving plate 2 and the cooling plate 3. Accordingly, a power output of the thermoelectric generation module 4 can be improved by enlarging the temperature difference between the heat-receiving plate 2 and the cooling plate 3. Specifically, the temperature of the entire heat-receiving plate 2 is increased by bringing the heat-receiving plate 2 close to a radiant heat source.

Figure 11:
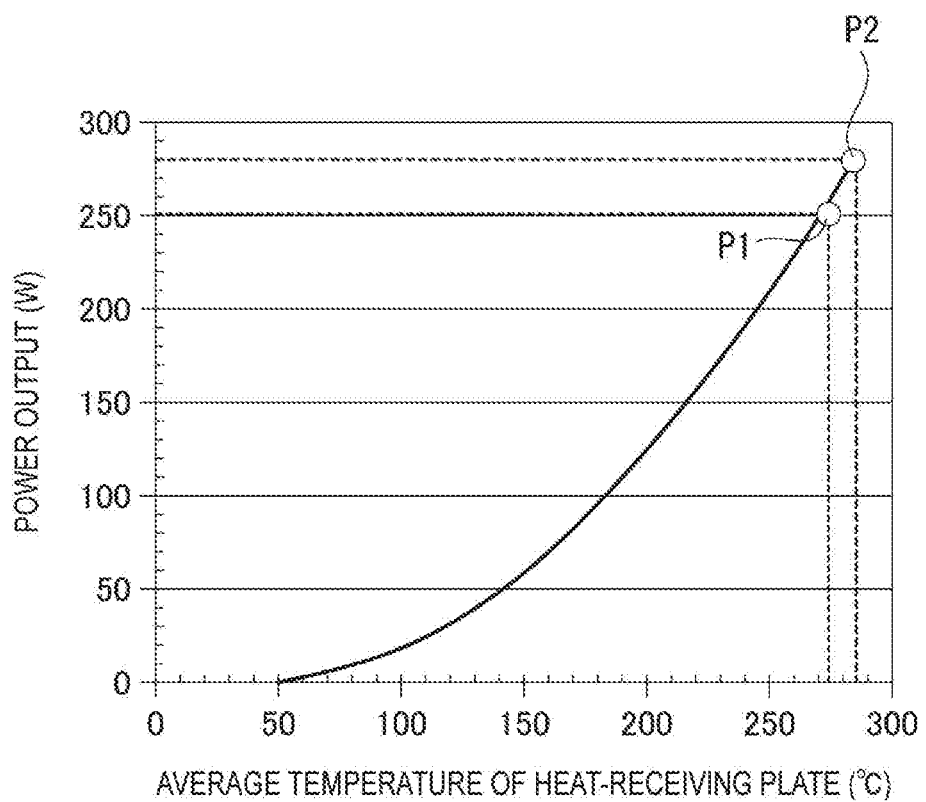
FIG. 11 is a graph showing a relationship between an average temperature and a power output in each of the heat-receiving plate according to exemplary embodiment and the typical heat-receiving plate.

When the average temperature of the heat-receiving plate 2 shown in FIG. 9 is 273.5 degrees C., the power output by the thermoelectric generation module 4 stops at 250 W as shown by a point P1 in FIG. 11.

On the other hand, when the average temperature of the heat-receiving plate 2 shown in FIG. 10 is 286 degrees C., the power output by the thermoelectric generation module 4 is improved to 280 W as shown by a point P2 in FIG. 11.

Since the thermoelectric generator 1 includes the temperature equalizer in the exemplary embodiment, the peripheral ends of the thermoelectric generation module 4 are not excessively heated by the radiant heat. Accordingly, since thermal stress is not increased at the peripheral ends of the thermoelectric generation module 4, damage due to overheating at the joint between the thermoelectric elements 4P and 4N at the peripheral ends of the thermoelectric generation module 4 and the electrode surface 4C of the high-temperature-side substrate 4A can be prevented.

Moreover, since the average temperature of the heat-receiving plate 2 can be increased owing to the temperature equalizer of the thermoelectric generator 1, the power output by the thermoelectric generation module 4 is improvable.

[4] Modification(s) of Embodiment(s)

The scope of the invention is not limited to the above exemplary embodiment, but includes modifications and improvements as long as an object of the invention can be achieved.

In the above exemplary embodiment, the central region 21 of the heat-receiving surface 2A of the heat-receiving plate 2 is covered with the black coating and the peripheral region 22 is in color of anodized-aluminum (i.e., in color of the bare metal), thereby forming the temperature equalizer. However, the temperature equalizer of the invention is not limited to the above.

Figure 12:
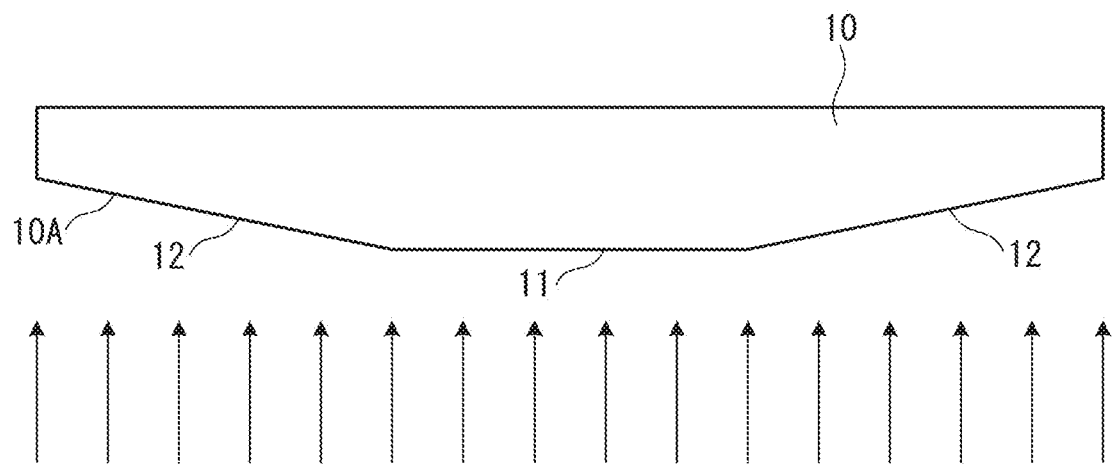
FIG. 12 is a side view showing a structure of a temperature equalizer in a modification.

For instance, in some embodiments, as shown in FIG. 12, the shape of the heat-receiving surface 10A of the heat-receiving plate 10 is changed such that an incident angle of the radiant heat to the central region 11 is 0 degrees and the incident angle of the radiant heat to the peripheral region 12 exceeds 0 degrees. In this case, since the peripheral region having the larger incident angle of radiant heat is less likely to absorb the radiant heat, temperature equalization is achievable in the same manner as in the exemplary embodiment.

Moreover, in the above exemplary embodiment, the temperature equalizer is configured to control the reception of the radiant heat by the heat-receiving surface 2A of the heat-receiving plate 2. However, the temperature equalizer of the invention is not limited to the above.

Figure 13:
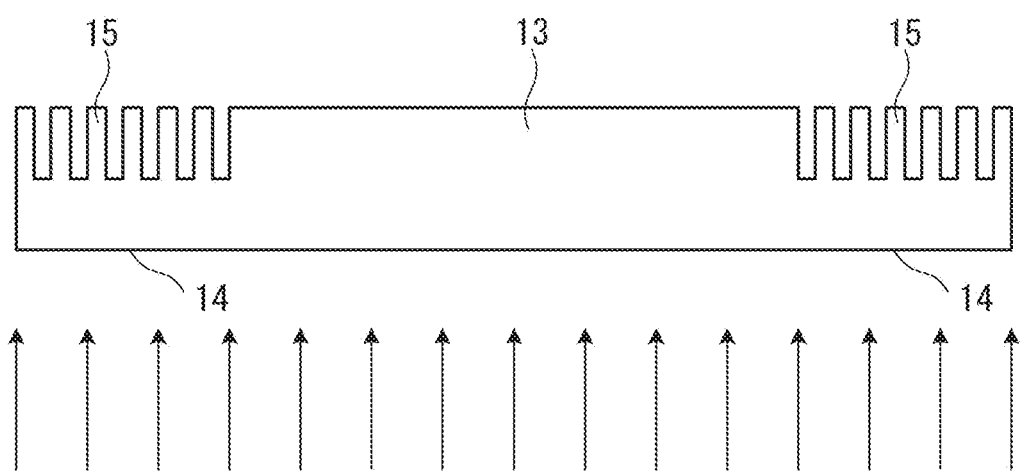
FIG. 13 is a side view showing a structure of a temperature equalizer in another modification.

For instance, in some embodiments, heat release fins 15 or the like are formed on a peripheral region 14 of a rear surface of a heat-receiving plate 13 as shown in FIG. 13, thereby improving a heat release efficiency to form the temperature equalizer.

Figure 14:
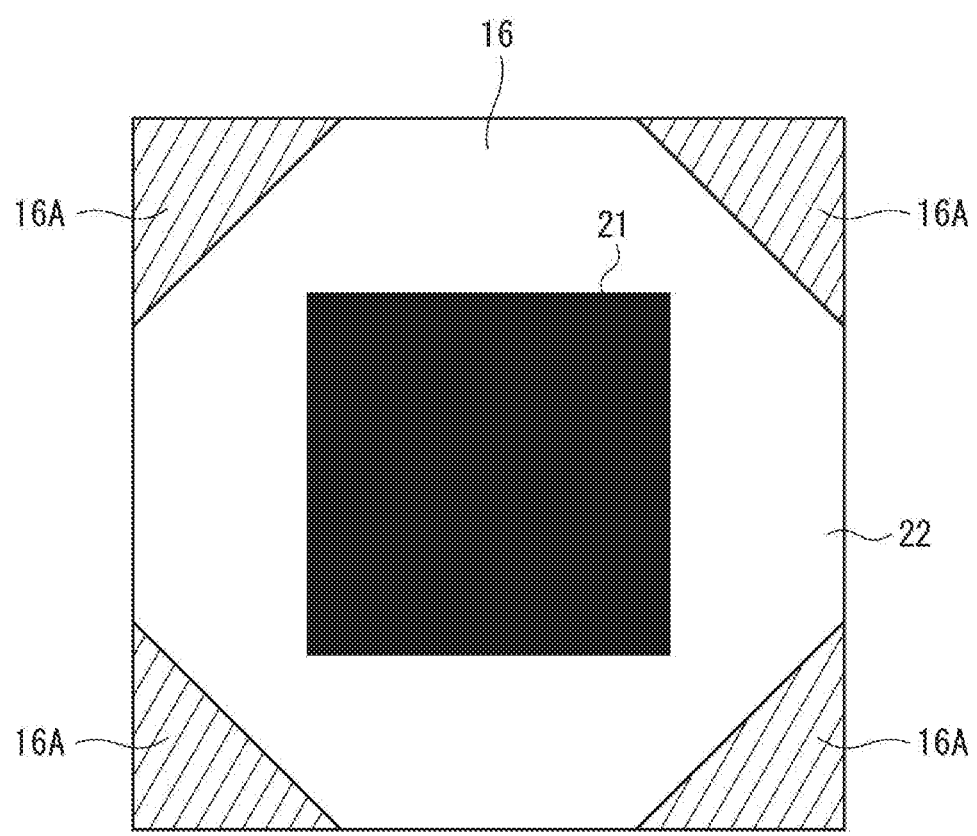
FIG. 14 is a plan view showing a structure of a temperature equalizer in still another modification.

Further, although the central region 21 is covered with the black coating and the peripheral region 22 is left in color of anodized-aluminum in the above exemplary embodiment, the invention is not limited thereto. For instance, in some embodiments, corners of a rectangular heat-receiving plate 16 are covered with a reflective coating or are jointed with reflective plates to form reflection regions 16A, as shown in FIG. 14.

Figure 15:
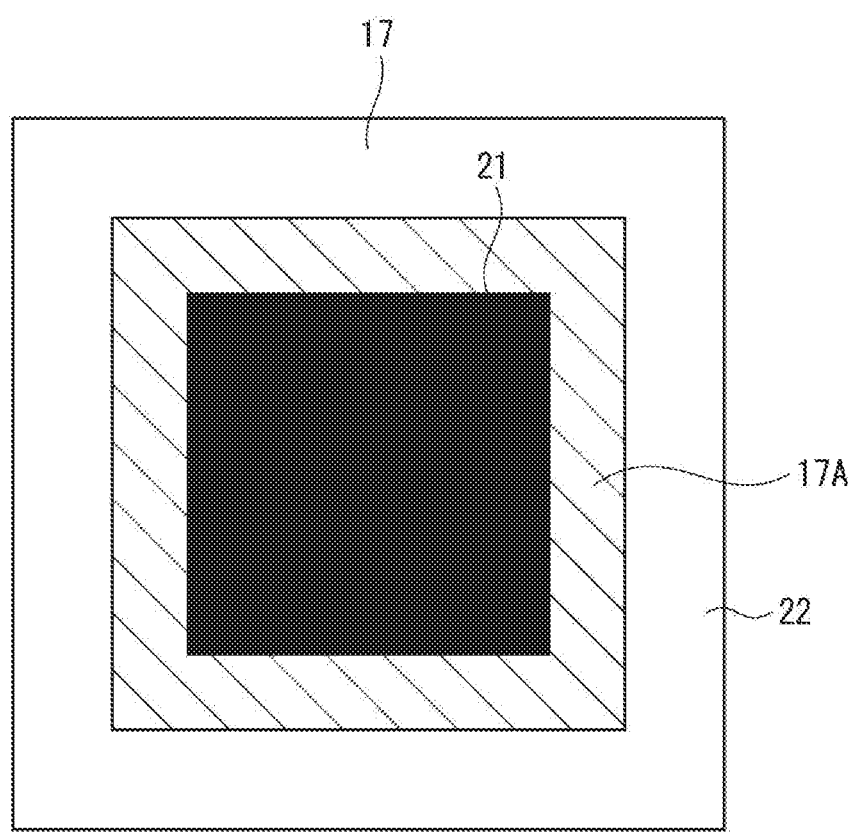
FIG. 15 is a plan view showing a structure of a temperature equalizer in a further modification.

Moreover, although the central region 21 is covered with the black coating and the peripheral region 22 is left in color of anodized-aluminum in the above exemplary embodiment, the invention is not limited thereto. For instance, in some embodiments, an intermediate region 17A in an intermediate color (e.g., in brown) is formed between the central region 21 and the peripheral region 22 of a heat-receiving plate 17 as shown in FIG. 15.

Figure 16:
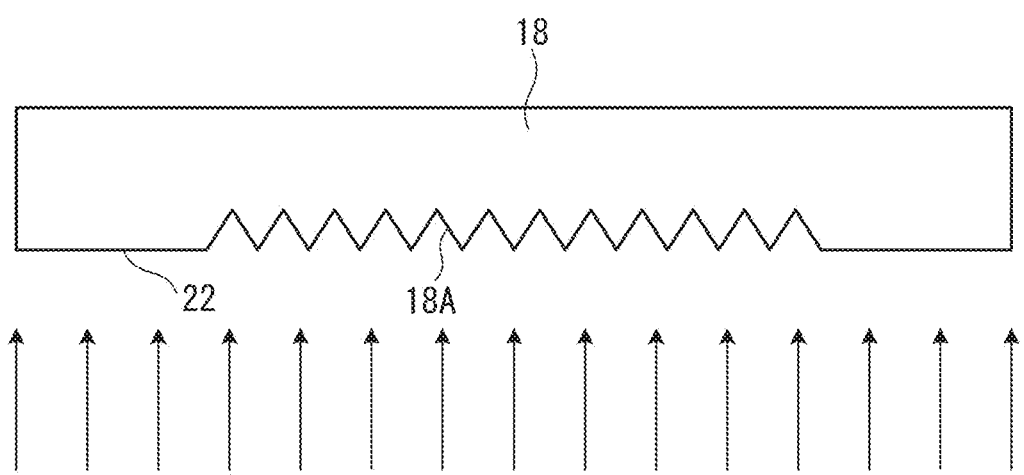
FIG. 16 is a side view showing a structure of a temperature equalizer in a still further modification.

Further, although the central region 21 is covered with the black coating in the above exemplary embodiment, the invention is not limited thereto. For instance, in some embodiments, a central region 18A of a heat-receiving plate 18 is processed to have irregularities by a texture processing and the like, as shown in FIG. 16.

As for the rest of the invention, any other structures and the like are applicable as long as an object of the invention is achievable.

The invention claimed is:

1. A thermoelectric generator comprising:
a heat-receiving plate comprising a heat-receiving surface configured to receive radiant heat;
a thermoelectric generation module provided to a surface of the heat-receiving plate opposite from the heat-receiving surface, the thermoelectric generation module having an area smaller than an area of the heat-receiving plate;
a cooling plate provided to a surface of the thermoelectric generation module opposite from a surface where the heat-receiving plate is provided; and
a temperature equalizer provided to the heat-receiving plate and configured to equalize a temperature of the heat-receiving surface by controlling a distribution of a radiant heat absorption rate of the heat-receiving surface,
wherein the temperature equalizer is configured to control the distribution of the radiant heat absorption rate of the heat-receiving surface such that the radiant heat absorption rate of a first part of the heat-receiving surface outside the thermoelectric generation module is lower than the radiant heat absorption rate of a second part of the heat-receiving surface corresponding to the thermoelectric generation module.

2. The thermoelectric generator according to claim 1, wherein the temperature equalizer comprises an inclined surface that is defined at the first part of the heat-receiving surface and inclined with respect to the second part of the heat-receiving surface.

3. The thermoelectric generator according to claim 1, wherein the temperature equalizer comprises a plurality of heat release fins disposed at the first part of the heat-receiving surface.

4. The thermoelectric generator according to claim 1, wherein the temperature equalizer comprises a texture that is defined at the second part of the heat-receiving surface and includes a plurality of protrusions and a plurality of recesses.

5. The thermoelectric generator according to claim 1, wherein the temperature equalizer comprises a coating material disposed on at least one of the first part of the heat-receiving surface or the second part of the heat-receiving surface.

6. The thermoelectric generator according to claim 5, wherein the coating material is disposed on the first part of the heat-receiving surface.

7. The thermoelectric generator according to claim 5, wherein the coating material is disposed on the second part of the heat-receiving surface.

8. A thermoelectric generator comprising:
a heat-receiving plate comprising a heat-receiving surface configured to receive radiant heat;
a thermoelectric generation module provided to a surface of the heat-receiving plate opposite from the heat-receiving surface, thermoelectric generation module having an area smaller than an area of the heat-receiving plate;
a cooling plate provided to a surface of the thermoelectric generation module opposite from a surface where the heat-receiving plate is provided; and
a temperature equalizer provided to the heat-receiving plate and configured to equalize a temperature of the heat-receiving surface by controlling a distribution of a radiant heat absorption rate of the heat-receiving surface,
wherein the temperature equalizer comprises a first part of the heat-receiving surface that is disposed outside the thermoelectric generation module and a second part of the heat-receiving surface that is inclined with respect to the first part of the heat-receiving surface and corresponds to the thermoelectric generation module such that the first part of the heat-receiving surface is inclined upward and away from the thermoelectric generation module relative to the second part of the heat-receiving surface.

9. The thermoelectric generator according to claim 8, wherein a first incident angle of the radiant heat to the first part of the heat-receiving surface is defined with respect to a first direction that is perpendicular to the first part of the heat-receiving surface,
wherein a second incident angle of the radiant heat to the second part of the heat-receiving surface is defined with respect to a second direction that is perpendicular to the second part of the heat-receiving surface, and
wherein the first incident angle of the radiant heat to the first part of the heat-receiving surface is larger than the second incident angle of the radiant heat to the second part of the heat-receiving surface.

10. The thermoelectric generator according to claim 9, wherein the second incident angle of the radiant heat to the second part of the heat-receiving surface is zero with respect to the second direction that is perpendicular to the second part of the heat-receiving surface.

11. The thermoelectric generator according to claim 8, wherein the second part of the heat-receiving surface is a central region of the heat-receiving surface, and
wherein the first part of the heat-receiving surface is a peripheral region disposed outside the central region of the heat-receiving surface and recessed relative to the central region.

12. The thermoelectric generator according to claim 8, wherein the second part of the heat-receiving surface is disposed at a central region of the heat-receiving surface, and wherein the first part of the heat-receiving surface is disposed at a peripheral region of the heat-receiving surface outside the central region.

13. The thermoelectric generator according to claim 12, wherein a vertical distance between the peripheral region and the thermoelectric generation module is greater than a vertical distance between the central region and the thermoelectric generation module.

14. The thermoelectric generator according to claim 12, wherein the peripheral region has an inner end that faces the central region and an outer end that is spaced apart from the inner end, and wherein a vertical distance between the outer end of the peripheral region and the thermoelectric generation module is greater than a vertical distance between the inner end of the peripheral region and the thermoelectric generation module.

* * * * *